United States Patent
Letz et al.

(10) Patent No.: US 8,193,086 B2
(45) Date of Patent: Jun. 5, 2012

(54) LOCAL SILICIDATION OF VIA BOTTOMS IN METALLIZATION SYSTEMS OF SEMICONDUCTOR DEVICES

(75) Inventors: Tobias Letz, Dresden (DE); Frank Feustel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 43 days.

(21) Appl. No.: 12/640,444

(22) Filed: Dec. 17, 2009

(65) Prior Publication Data

US 2010/0164123 A1    Jul. 1, 2010

(30) Foreign Application Priority Data

Dec. 31, 2008   (DE) .................. 10 2008 063 417

(51) Int. Cl.
*H01L 21/4763*    (2006.01)
(52) U.S. Cl. .............. 438/630; 438/687; 438/637
(58) Field of Classification Search .......... 438/630, 438/649, 664, 652, 653, 682, 687, 637
See application file for complete search history.

(56) References Cited

U.S. PATENT DOCUMENTS

| | | | |
|---|---|---|---|
| 6,867,135 B1 | 3/2005 | Bao et al. ................ | 438/687 |
| 7,396,759 B1 | 7/2008 | van Schravendijk et al. . | 438/628 |
| 2004/0097075 A1 | 5/2004 | Bradshaw et al. ........... | 438/687 |
| 2007/0082488 A1 | 4/2007 | Katou ......................... | 438/687 |
| 2007/0190735 A1 | 8/2007 | Hacker et al. ................ | 438/311 |
| 2008/0233734 A1 | 9/2008 | Ohara et al. ................. | 438/618 |
| 2009/0134521 A1* | 5/2009 | Liu et al. ..................... | 257/762 |
| 2009/0283910 A1* | 11/2009 | Hinomura ................... | 257/751 |
| 2009/0305498 A1* | 12/2009 | Streck et al. ................ | 438/627 |
| 2010/0221911 A1* | 9/2010 | Aubel et al. ................. | 438/643 |
| 2010/0289125 A1* | 11/2010 | Feustel et al. ............... | 257/632 |
| 2011/0003474 A1* | 1/2011 | Liu et al. ..................... | 438/653 |

FOREIGN PATENT DOCUMENTS

| | | |
|---|---|---|
| DE | 102006056624 A1 | 6/2008 |
| EP | 1 282 168 A2 | 2/2003 |

OTHER PUBLICATIONS

PCT Search Report and Written Opinion from PCT/US2009/068673 dated Apr. 28, 2010.
Translation of Official Communication from German Patent Office for German Patent Application No. 10 2008 063 417.4 dated Nov. 4, 2009.

* cited by examiner

*Primary Examiner* — Sheila V. Clark
(74) *Attorney, Agent, or Firm* — Williams, Morgan & Amerson, P.C.

(57) ABSTRACT

Electromigration behavior in complex metallization systems of semiconductor devices may be enhanced at critical areas between a metal line and a via by locally forming a copper/silicon compound. In some illustrative embodiments, the formation of the copper/silicon compound may be combined with other treatments for cleaning the exposed surface areas and/or modifying the molecular structure thereof.

21 Claims, 5 Drawing Sheets

LOCAL SILICIDATION OF VIA BOTTOMS IN METALLIZATION SYSTEMS OF SEMICONDUCTOR DEVICES

BACKGROUND OF THE INVENTION

1. Field of the Invention

Generally, the present disclosure relates to microstructures, such as advanced integrated circuits, and, more particularly, to metallization systems comprising sophisticated dielectric and conductive materials.

2. Description of the Related Art

In the fabrication of modern microstructures, such as integrated circuits, there is a continuous drive to steadily reduce the feature sizes of microstructure elements, thereby enhancing the functionality of these structures. For instance, in modern integrated circuits, minimum feature sizes, such as the channel length of field effect transistors, have reached the deep sub-micron range, thereby increasing performance of these circuits in terms of speed and/or power consumption and/or diversity of functions. As the size of individual circuit elements is reduced with every new circuit generation, thereby improving, for example, the switching speed of the transistor elements, the available floor space for interconnect lines electrically connecting the individual circuit elements is also decreased. Consequently, the dimensions of these interconnect lines are also reduced to compensate for a reduced amount of available floor space and for an increased number of circuit elements provided per unit die area as typically the number of interconnections required increases more rapidly than the number of circuit elements. Thus, a plurality of stacked "wiring" layers, also referred to as metallization layers, is usually provided, wherein individual metal lines of one metallization layer are connected to individual metal lines of an overlying or underlying metallization layer by so-called vias. Despite the provision of a plurality of metallization layers, reduced dimensions of the interconnect lines are necessary to comply with the enormous complexity of, for instance, modern CPUs, memory chips, ASICs (application specific ICs) and the like.

Advanced integrated circuits, including transistor elements having a critical dimension of 0.05 μm and even less, may, therefore, typically be operated at significantly increased current densities of up to several kA per $cm^2$ in the individual interconnect structures, despite the provision of a relatively large number of metallization layers, owing to the significant number of circuit elements per unit area. Consequently, well-established materials, such as aluminum, are being replaced by copper and copper alloys, a material with significantly lower electrical resistivity and improved resistance to electromigration, even at considerably higher current densities, compared to aluminum. The introduction of copper into the fabrication of microstructures and integrated circuits comes along with a plurality of severe problems residing in copper's characteristic to readily diffuse in silicon dioxide and a plurality of low-k dielectric materials, which are typically used in combination with copper in order to reduce the parasitic capacitance within complex metallization layers. In order to provide the necessary adhesion and to avoid the undesired diffusion of copper atoms into sensitive device regions, it is, therefore, usually necessary to provide a barrier layer between the copper and the dielectric material in which the copper-based interconnect structures are embedded. Although silicon nitride is a dielectric material that effectively prevents the diffusion of copper atoms, selecting silicon nitride as an interlayer dielectric material is less than desirable, since silicon nitride exhibits a moderately high permittivity, thereby increasing the parasitic capacitance of neighboring copper lines, which may result in non-tolerable signal propagation delays. Hence, a thin conductive barrier layer that also imparts the required mechanical stability to the copper is usually formed so as to separate the bulk copper from the surrounding dielectric material, thereby reducing copper diffusion into the dielectric materials and also reducing the diffusion of unwanted species, such as oxygen, fluorine and the like, into the copper. Furthermore, the conductive barrier layers may also provide highly stable interfaces with the copper, thereby reducing the probability for significant material transport at the interface, which is typically a critical region in view of increased diffusion paths that may facilitate current-induced material diffusion. Currently, tantalum, titanium, tungsten and their compounds with nitrogen and silicon and the like are preferred candidates for a conductive barrier layer, wherein the barrier layer may comprise two or more sub-layers of different composition so as to meet the requirements in terms of diffusion suppressing and adhesion properties.

Another characteristic of copper significantly distinguishing it from aluminum is the fact that copper may not be readily deposited in larger amounts by chemical and physical vapor deposition techniques, thereby requiring a process strategy that is commonly referred to as the damascene or inlaid technique. In the damascene process, first, a dielectric layer is formed which is then patterned to include trenches and/or vias which are subsequently filled with copper, wherein, as previously noted, prior to filling in the copper, a conductive barrier layer is formed on sidewalls of the trenches and vias. The deposition of the bulk copper material into the trenches and vias is usually accomplished by wet chemical deposition processes, such as electroplating and electroless plating, thereby requiring the reliable filling of vias with an aspect ratio of 5 and more with a diameter of 0.3 μm or even less in combination with trenches having a width ranging from 0.1 μm to several μm. Electrochemical deposition processes for copper are well established in the field of electronic circuit board fabrication. However, for the dimensions of the metal regions in semiconductor devices, the void-free filling of high aspect ratio vias is an extremely complex and challenging task, wherein the characteristics of the finally obtained copper-based interconnect structure significantly depend on process parameters, materials and geometry of the structure of interest. Since the geometry of interconnect structures is substantially determined by the design requirements and may, therefore, not be significantly altered for a given microstructure, it is of great importance to estimate and control the impact of materials, such as conductive and non-conductive barrier layers, the copper microstructure and the like, and their mutual interaction on the characteristics of the interconnect structure as a whole to insure both high yield and the required product reliability. In particular, it is important to identify, monitor and reduce degradation and failure mechanisms in metallization systems for various configurations to maintain device reliability for every new device generation or technology node.

Accordingly, a great deal of effort is being made in investigating the degradation of copper interconnects, especially in combination with low-k dielectric materials or ultra low-k (ULK) materials having a relative permittivity of 3.0 or even less, in order to find new materials and process strategies for forming copper-based lines and vias with a low overall permittivity and superior reliability.

One failure mechanism which is believed to significantly contribute to a premature device failure is the electromigration-induced material transport, particularly along an interface formed between the copper and a dielectric cap layer, which may be provided after filling in the copper material in the trenches and via openings, the sidewalls of which are coated by the conductive barrier materials. In addition to maintaining copper integrity, the dielectric cap layer may usually act as an etch stop layer during the formation of the via openings in the interlayer dielectric. Frequently used materials are, for example, silicon nitride and nitrogen-containing silicon carbide, which exhibit a moderately high etch selectivity to typically employed interlayer dielectrics, such as a plurality of low-k dielectric materials, and also suppress the diffusion of copper onto the interlayer dielectric. Recent research results seem to indicate, however, that the interface formed between the copper and dielectric cap layer is a major diffusion path for material transport during operation of the metal interconnect, wherein, in particular, the area around the interface between the metal line and a via connecting thereto turn out to be failure prone.

Consequently, a plurality of alternatives have been developed in an attempt to enhance the interface characteristics between the copper and the cap layer having the capability of reliably confining the copper and maintaining its integrity. For example, it has been proposed to selectively provide conductive materials on top of the copper-containing region, which may exhibit superior electromigration performance while not unduly increasing the overall resistance of the corresponding metal line. For instance, various alloys, such as a compound of cobalt/tungsten/phosphorous (CoWP), a compound of nickel/molybdenum/phosphorous (NiMoP) and the like, have proven to be promising candidates for conductive cap layers, which may significantly reduce electromigration effects within a corresponding metal line.

Although these compounds provide superior electromigration performance, the implementation of an appropriate manufacturing process flow into well-established process strategies for forming complex metallization systems is associated with significant efforts with respect to preparing the exposed surface for the corresponding electrochemical deposition process. Moreover, frequently, severe defects may be observed in metallization systems including copper lines with a conductive cap layer formed on the basis of electrochemical deposition techniques, since increased leakage currents and dielectric breakdown events may occur in such devices compared to devices having a metallization system based on a dielectric cap layer.

In other strategies, the incorporation of certain species into the copper surface has been proven to be a viable technique for enhancing the overall electromigration behavior, for instance, in combination with a corresponding cap or etch stop layer. Thus, in some conventional process regimes, the exposed surface of the copper lines may be exposed to a reactive ambient in order to incorporate silicon, nitrogen and the like for enhancing the surface characteristics of the metal lines prior to depositing the cap or etch stop material. For example, a silicon and/or nitrogen-containing species may be supplied into the reactive ambient of a plasma-based cleaning process in order to initiate the inter-diffusion of silicon, nitrogen and the like, thereby forming a corresponding copper compound that may significantly enhance the overall surface characteristics. For instance, silane may be used in a corresponding plasma treatment in order to form a silicon/copper compound, which may also be referred to as copper silicide, which may provide superior electromigration behavior. It has been recognized, however, that, upon forming an opening of a via connecting to the lower lying metal line, the final etch step for etching through the dielectric cap layer or etch stop layer, a significant deterioration of the surface characteristics may be caused, which may thus result in a significantly reduced reliability of the metallization system due to a premature electromigration-induced failure of the interconnect system.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides techniques and semiconductor devices in which superior electromigration behavior may be achieved by locally enhancing the electromigration characteristics of a metal line and a via in the vicinity of the corresponding interface. To this end, a silicon species may be locally introduced into a portion of the metal line, i.e., a copper-containing surface area, in order to locally provide a copper/silicon compound or a copper silicide. Consequently, a corresponding damage of a previously formed copper silicide material may be locally compensated for while, in other cases, the copper silicide may be formed exclusively in the vicinity of the interface between the via and the metal line, thereby specifically enhancing the electromigration behavior at a highly failure-prone area.

One illustrative method disclosed herein relates to forming a metallization system of a semiconductor device. The method comprises forming an opening in a dielectric layer of a first metallization layer of a metallization system, wherein the opening exposes a portion of a copper-containing metal region of a second metallization layer of the metallization system. Moreover, the method comprises forming a copper/silicon compound selectively in the exposed portion of the copper-containing metal region.

A further illustrative method disclosed herein comprises forming a dielectric cap material on a copper-containing surface of a metal region of a first metallization layer of a metallization system of a semiconductor device. Moreover, a low-k dielectric material of a second metallization layer is formed above the dielectric cap material. Additionally, the method comprises forming an opening in the low-k dielectric material to expose a portion of the copper-containing surface. Finally, a silicon and copper-containing mixture is formed in the metal region through the portion of the copper-containing surface.

One illustrative semiconductor device disclosed herein comprises a first low-k dielectric layer formed above a substrate and comprising a first copper-containing metal region. A dielectric cap layer is formed on the first low-k dielectric layer and the copper-containing metal region. Additionally, a second low-k dielectric layer is formed on the dielectric cap layer and comprises a second copper-containing metal region. The semiconductor device further comprises a metal-filled via formed in the second low-k dielectric layer and the dielectric cap layer, wherein the metal-filled via connects the first metal region to the second metal region. Finally, the semiconductor device comprises a copper silicide material formed at least around an interface formed by the first metal region and the via, wherein the copper silicide material extends to a depth within the first metal region that is greatest at the interface.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein addresses the problem of reduced reliability of complex metallization systems caused by a premature contact failure occurring in the vicinity of an interface between a metal line and a via. To this end, a copper/silicon compound may be locally formed after exposing a corresponding surface area of the lower-lying metal line so that a superior electromigration behavior may be established or re-established on the basis of the copper/silicon material. Consequently, enhanced electro-migration behavior may be accomplished without requiring sophisticated metal cap layers, which may typically be formed on the basis of sophisticated electrochemical deposition recipes, which, however, may contribute to increased yield loss due to increased leakage currents and premature dielectric breakdown. The overall manufacturing flow for locally providing the copper silicon compound may be efficiently integrated in the overall process flow, for instance by appropriately adapting reactive atmospheres that may typically be used for surface treatments after patterning the corresponding via opening and prior to depositing a metal-containing material therein. For instance, in some illustrative embodiments disclosed herein, the copper/silicon compound may be formed after exposing the corresponding surface portion of the metal region during a process for removing any etch-related byproducts, such as resist material, polymer materials, which may have been created during the etch process, and the removing of the resist material and any other materials used for patterning the dielectric material. In this case, a corresponding plasma-based treatment, for instance using oxygen plasma, may be appropriately adapted, at least during a certain phase of the plasma-based process, in order to introduce a silicon-containing precursor gas, such as silane and the like, thereby initiating a silicon diffusion into the exposed copper-containing surface. Consequently, a copper silicon compound may be locally formed substantially without increasing the overall process complexity or the cycle times of the associated processes. Thereafter, the further processing may be continued by performing additional surface treatments, if required, and finally depositing a conductive barrier material and filling the via, possibly in combination with a trench, with copper material.

In still other illustrative embodiments, in addition to or alternatively to introducing a silicon species in the process step for removing surface contaminations and resist residuals, a corresponding silicon diffusion may be initiated during a process for hardening or densifying exposed surface areas of the dielectric material, in which the via opening is formed so as to extend to the lower-lying copper-containing metal region. As discussed above, in sophisticated metallization systems, there is an ongoing demand for reducing the parasitic capacitance between closely spaced metal regions, which in turn may require the incorporation of dielectric materials with significantly reduced permittivity. For instance, the dielectric constant of materials of 3.0 or 2.7 or significantly less may be accomplished by providing a low-k dielectric base material and generating pores therein, thereby even further reducing the overall chemical and mechanical resistivity of low-k dielectric materials, which may per se exhibit a generally reduced resistivity. Consequently, frequently, a corresponding surface treatment may be performed to modify at least the surface characteristics of these materials prior to performing further manufacturing steps, such as the deposition of a conductive barrier material and a chemical mechanical polishing process for removing any excess material of copper and the like, which may result in a significant mechanical stress caused in the sensitive low-k dielectric material. Furthermore, during a corresponding treatment, the degree of porosity at the exposed surface areas of the dielectric material may be reduced, which may be accomplished by exposing the device to elevated temperatures and appropriate substances, such as silicon-containing substances in the form of HMDS (hexamethyldisilazane). Also in this case, the corresponding ambient for treating the sensitive dielectric material may be appropriately adapted in order to obtain a significant silicon diffusion into the exposed copper-containing surface in order to form the copper silicide therein. For example, additional silicon-containing species may be applied and/or the silicon-containing species that may be used for the surface treatment of the sensitive low-k dielectric material may be appropriately controlled, for instance in terms of silicon concentration, in order to obtain the desired degree of silicon diffusion into the exposed copper-containing surfaces.

In still other illustrative embodiments, a silicon diffusion into the exposed copper-containing surface may be initiated during a further surface treatment of the sensitive low-k dielectric material, which may have suffered from a certain degree of damaging in the preceding etch and resist removing processes. Also in this case, frequently, a silicon-containing species may be brought into contact with the damaged surface of the low-k dielectric material, in order to re-establish or repair the damaged surface area at least to a certain degree. Consequently, at least during a certain phase of this treatment, the process conditions may be appropriately selected, i.e., the silicon concentration may be increased by applying appropriate precursor materials, such as silane, HMDS and the like, in order to obtain the desired copper silicide in the vicinity of the exposed metal surface.

In other illustrative embodiments, a silicon species may be incorporated by providing a specifically designed precursor layer on the exposed metal surface in a highly controlled manner. For instance, a carrier species may be prepared so as to contain the desired silicon species and may be brought into contact with the exposed copper-containing surface in order to form a layer of well-controlled thickness, which may be decomposed in a further process step, thereby providing highly stable process conditions for the diffusion of silicon species into a copper-containing surface. In this manner, the process conditions within the via opening and in the immediate vicinity of the copper-containing surface may be "adjusted" with enhanced accuracy, irrespective of "global" process parameters, such as temperature, pressure and the like, since the amount of silicon species that is in contact with the copper-containing surface may be controlled on the basis of the previously formed precursor layer. For example, triazole and any derivatives thereof are well-established materials, which react with copper in a defined manner, for instance by forming a corresponding "surface layer," depending on the overall size of the molecules that may act as carriers for conveying the silicon species. Thus, the carrier molecules may adhere to the copper-containing surface, substantially without affecting any exposed surface areas of the dielectric material, thereby also positioning a well-controllable amount of silicon species at the copper-containing surface. Thereafter, the silicon species may be released by decomposing the carrier material, which may be accomplished by using elevated temperatures, radiation, such as UV radiation, and the like. Thus, in the subsequent silicon diffusion process, a well-controlled amount of silicon species may be incorporated into the copper-containing surface so that a highly controllable amount of copper silicide may be formed, substantially without affecting the dielectric material. As a consequence, forming the copper silicide may be performed at any appropriate manufacturing stage prior to depositing the barrier material, thereby providing a high degree of flexibility in designing the overall manufacturing flow, in particular with respect to removing etch contaminants, treating or modifying surface characteristics of the sensitive dielectric material, while nevertheless providing a highly controllable incorporation of the silicon species.

Figure 1A:
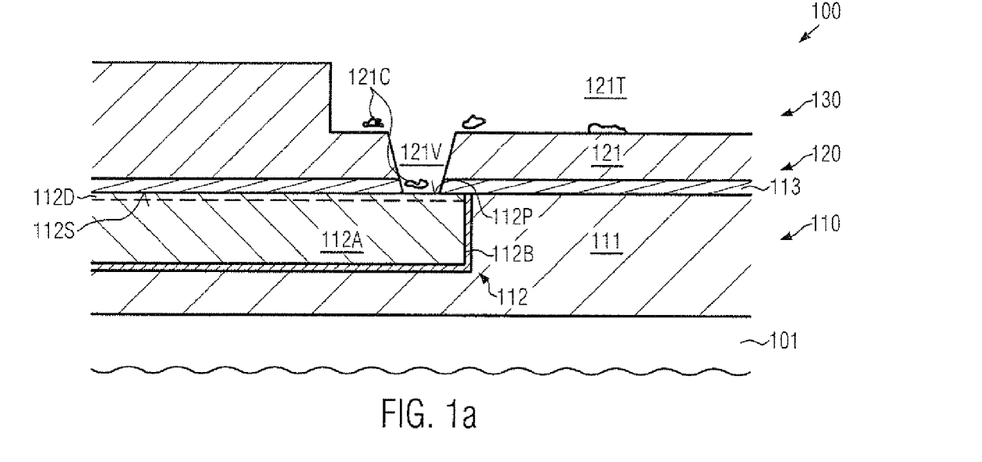
FIGS. 1a-1b schematically illustrate cross-sectional views of a semiconductor device during various manufacturing stages in forming a metallization system, in which a copper/silicon compound may be locally formed in a metal line during a surface treatment performed so as to remove any etch byproducts created during the preceding etch processes, according to illustrative embodiments.

FIG. 1a schematically illustrates a cross-sectional view of a semiconductor device 100 comprising a substrate 101, in and above which may be formed circuit elements, such as transistors and the like, as required by the overall circuit configuration of the semiconductor device 100. As previously indicated, the continuous shrinkage of the critical feature sizes, which may currently be at approximately 50 nm and less, requires a corresponding adaptation of the feature sizes of metal lines and vias in a metallization system 130 of the device 100. In the embodiment shown in FIG. 1a, the metallization system 130 may comprise a first metallization layer 110 and a second metallization layer 120. It should be appreciated, however, that the metallization system 130 may comprise any number of metallization layers, depending on the overall complexity of the device 100. For convenience, any further metallization layers, which may have to be formed above the layer 120 or which may be formed below the metallization layer 110, are not shown. The metallization layer 110 may comprise a dielectric material 111, such as a low-k dielectric material having a dielectric constant of 3.0 or less, while, in more sophisticated applications, the dielectric constant may be approximately 2.7 and less, in which case corresponding materials may also be referred to as ultra low-k (ULK) materials. Moreover, the metallization layer 110 may comprise a plurality of metal regions or metal lines 112, wherein, for convenience, only a single metal line is illustrated in FIG. 1a. The metal line or region 112 may comprise a highly conductive core material 112A based on copper while a conductive barrier material 112B may confine the core material 112A, for instance with respect to diffusion of copper atoms into the surrounding dielectric material and with respect to the incorporation of reactive components, such as oxygen, fluorine and the like which may be present in the dielectric material 111. Furthermore, as previously explained, the conductive barrier material 112B may provide the desired adhesion of the core material 112A to the surrounding dielectric material 111 and may also establish a strong interface with the highly conductive core material 112A in order to provide the desired electromigration behavior. For instance, tantalum, tantalum nitride and the like may frequently be used as barrier materials for copper-based metallization systems. Furthermore, a dielectric cap layer 113, for instance comprised of silicon carbide, nitrogen-containing silicon carbide, silicon nitride and the like, may be formed on the dielectric material 111 and on the metal line 112. In view of reducing the overall parasitic capacitance in the metallization system 130, the material 113 may be selected so as to exhibit a moderately low permittivity, while nevertheless providing the desired etch stop and adhesion and confinement characteristics as required. In some illustrative embodiments, the dielectric cap layer 113 is formed on the surface 112S of the core material 112A so as to form a corresponding interface having a desired electromigration behavior, without providing a silicon species therein, if the overall electromigration performance is considered appropriate. In other cases, the surface 112S may be appropriately modified prior to forming the cap layer 113 in order to further enhance the overall electromigration performance. For instance, in some illustrative embodiments, a copper silicide, i.e., a copper/silicon compound, may be formed at and in the surface 112S in order to provide, in combination with the dielectric cap layer 113, a desired increased strength of a corresponding interface. It should be appreciated that a depth 112D or thickness of a correspondingly modified surface portion, which may also be indicated as 112S, may be selected so as to provide the desired interface characteristics without unduly affecting the overall electrical performance of the metal line 112. That is, since an enhanced interface behavior at interfaces connecting to a via may be provided in a later manufacturing stage, any damage that may be created locally within the surface portion 112S may not have to be taken into consideration when selecting the depth 112D for the metal line 112. Consequently, if an additional surface modification is provided in view of enhancing the overall electromigration performance of the metal line 112, the depth 112D may be selected independently from the subsequent processing for forming corresponding vias connecting to the line 112, since a corresponding damaging of the surface portion 112S may be compensated for in a local manner, as will be explained later on.

The metallization layer 120 may comprise, in the manufacturing stage shown, a dielectric material 121, which may also represent a low-k dielectric material in sophisticated applications. Moreover, a trench 121T and a via opening 121V may be formed in the dielectric material 121, wherein the via opening 121V may extend through the cap layer 113 into the metal line 112, thereby exposing a portion 112P of the core material 112A. Thus, the exposed portion 112P may represent a copper-containing surface, irrespective of whether a specific surface portion 112S may have been formed in an earlier manufacturing stage, for instance by incorporating a silicon species. Furthermore, due to the preceding manufacturing sequence, a plurality of contaminants 121C, for instance in the form of resist material, polymers and the like, may still be present.

The semiconductor device 100 as illustrated in FIG. 1a may be formed on the basis of the following processes. After forming corresponding circuit elements, such as transistors, in a corresponding semiconductor material provided above the substrate 101, a corresponding contact structure (not shown) may be formed on the basis of well-established process techniques, in order to provide an interface between the circuit elements formed in and above the semiconductor material and the metallization system 130. Thereafter, one or more metallization layers may be formed, such as the layer 110. For this purpose, the dielectric material 111 may be deposited on the basis of any appropriate deposition technique, such as chemical vapor deposition (CVD), spin-on techniques and the like, depending on the type of material to be deposited. Next, the dielectric material 111 may be patterned on the basis of sophisticated lithography and etch strategies, wherein, if required, corresponding mechanisms for enhancing the electromigration behavior may also be implemented, as will also be described when referring to the metallization layer 120. Finally, the corresponding openings may be filled with a metal-containing material in order to provide the barrier material 121B and the highly conductive copper-based core material 112A. Thereafter, any excess material may be removed by, for instance, chemical mechanical polishing (CMP) so as to provide electrically isolated metal lines in the dielectric material 111. In some illustrative embodiments, the surface 112S may be treated so as to exhibit superior electromigration performance, for instance, by incorporating a silicon species, possibly in combination with a nitrogen species, wherein, however, in illustrative embodiments, the corresponding depth 112D of the surface modification may be reduced compared to conventional strategies, thereby enhancing electrical performance for a given critical dimension of the metal line 112. Next, the dielectric cap layer 113 may be deposited on the surface 112S and on the dielectric material 111, which may be accomplished on the basis of well-established CVD techniques. It should be appreciated that the dielectric cap layer 113 may comprise two or more material compositions in order to obtain the desired confining and etch stop capabilities. Thereafter, the dielectric material 121 may be deposited, as previously explained with reference to the material 111, and a corresponding patterning sequence may be performed to form the trench 121T and the via opening 121V. In some illustrative embodiments, the via opening 121V may be formed first, for instance by providing a corresponding etch mask on the basis of photo lithography and performing an anisotropic etch process, which may be reliably stopped on and in the dielectric cap layer 113. Thereafter, the trench 121T may be formed, for instance by depositing a planarization material so as to temporarily fill the opening 121V and providing a corresponding etch mask for the trench 121T. Thereafter, the material 121 may be patterned and the etch mask and the corresponding fill material may be removed, while also removing the remaining cap material 113 within the opening 121V to expose the portion 112P. During this final etch step, a significant modification of any surface material may occur, which may conventionally result in a significant damage of, for instance, a copper silicide material, thereby reducing the effectiveness thereof in view of the overall electromigration behavior. It should be appreciated that other process strategies may be used for providing the trench 121T and the via opening 121V, wherein, also, at least on etching through the layer 113, a corresponding damage of copper silicide, if provided, may occur. For instance, in some approaches, the via opening 121V may be formed in a first etch step so as to extend to a certain depth within the dielectric material 121 and subsequently the trench 121T and remaining portion of the via 121V may be formed in a common etch process, thereby also requiring a specific step for opening the dielectric cap material 113. In other cases, the trench 121T may be formed first and, thereafter, an appropriate etch mask may be provided to form the via opening 121V so as to finally expose the portion 112P. During the complex patterning regime including processes for removing the resist material and any other materials for temporarily planarizing the surface and acting as an anti-reflective coating (ARC) material, the contaminants 121C may be created.

Figure 1B:
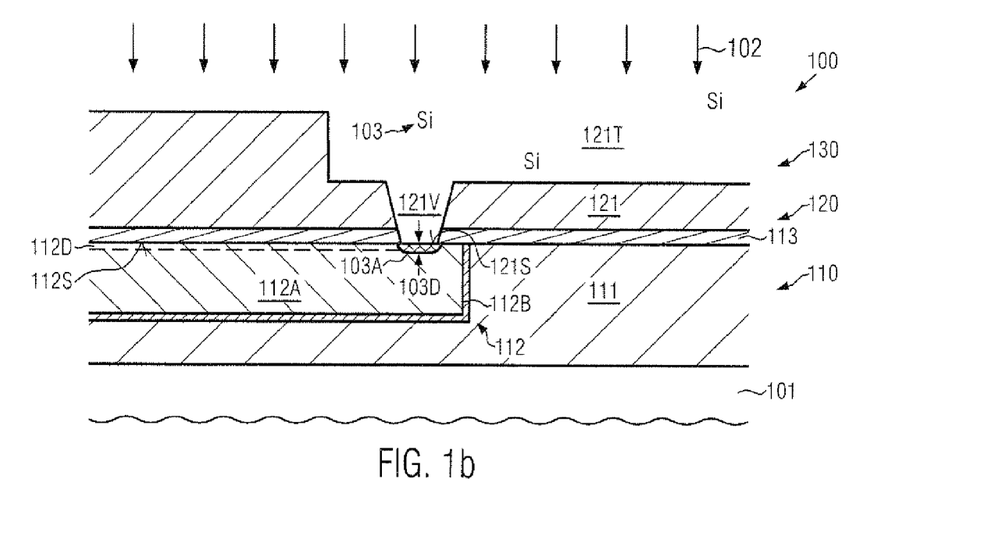

FIG. 1b schematically illustrates the semiconductor device 100 in a further advanced stage in which the device 100 is exposed to a reactive ambient 102 to remove the contaminants 121C (FIG. 1a), which may be accomplished by using a plasma ambient including an oxygen species. When exposed to the ambient 102, at least at a final phase, a precursor material may be supplied to the ambient 102 in order to provide a silicon species 103 therein, which may thus interact with the exposed surface portion 112P. For instance, a silane or any derivative thereof may be supplied to the ambient 102 to obtain a reactive silicon species that may diffuse into the surface portion 112P, thereby forming a copper/silicon compound 103A, which may also referred to as copper silicide. Due to the diffusion process, the corresponding copper/silicon compound 103A may be centered around the interface 121S defined by the via opening 121V and the metal line 112. Consequently, the compound 103A may provide enhanced strength of any metal material still to be formed in the via opening 121V during the further processing. Furthermore, further damaging of the compound 103A during subsequent manufacturing processes prior to depositing a conductive barrier material may be less critical due to corresponding local adjustment of a corresponding amount or thickness of the compound 103A. For instance, in embodiments in which a copper silicide may have been formed in the remaining metal line 112 on the basis of the depth 112D, the compound 103A may extend to a specific depth 103D that may be greater than the depth 112D, thereby also providing a corresponding lateral extension of the compound 103A as may be required for providing enhanced electromigration performance. It should be appreciated that corresponding lateral and vertical extension of the compound 103A may be controlled on the basis of process parameters, such as flow rate of the silicon-containing precursor material for given parameters for temperature, pressure, plasma power or any low frequency bias power, of the process 102. Consequently, the process parameters of the process 102 may be selected in accordance with well-established recipes for efficiently removing the contaminants 121C, while the characteristics of the compound 103A, for instance a depth 103D thereof, may be efficiently selected by controlling the point in time of supplying the silicon-containing precursor material and also controlling the flow rate thereof. Appropriate process parameters may be readily established by performing corresponding tests, in which silicon concentration and penetration depths may be measured for different precursor materials, flow rates, and for given conditions of the basic plasma process.

In still other illustrative embodiments, the surface cleaning process 102 may also comprise a wet chemical treatment, in which, at a certain phase, a silicon-containing species may be incorporated in order to initiate a corresponding silicon diffusion for forming the compound 103A. In other cases, an additional process step may be performed, for instance on the basis of a wet chemical etch step, to form a precursor layer, as will be described later on in more detail.

After providing the copper/silicon compound 103A, the further processing may be continued by, for instance, depositing a conductive barrier material, such as the material 112B, followed by the deposition of a copper material using well-established electrochemical deposition techniques. In other cases, a further treatment may be required for adapting the surface characteristics of the sensitive dielectric material 121, and corresponding processes may be performed prior to depositing the conductive barrier material.

Figure 1C:
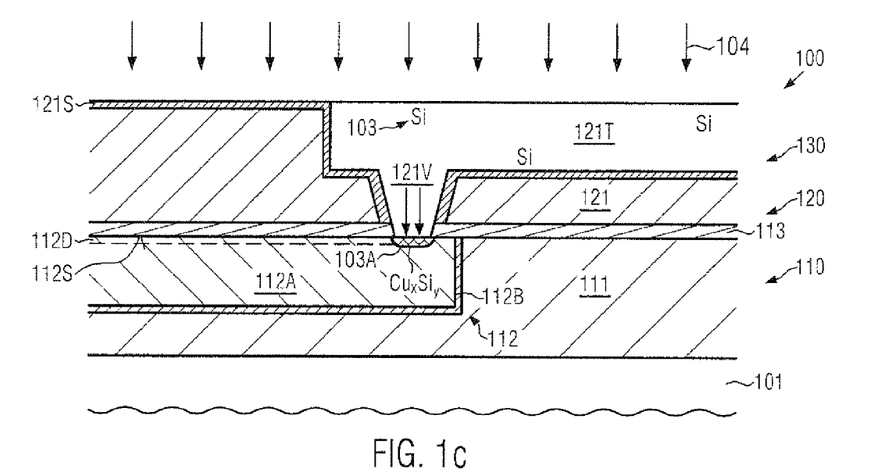
FIG. 1c schematically illustrates a cross-sectional view of the semiconductor device, in which the copper/silicon compound may be locally formed in a manufacturing stage in which the surface of a sensitive dielectric material may be hardened or densified, according to other illustrative embodiments.

FIG. 1c schematically illustrates the semiconductor device 100 when exposed to a treatment ambient 104, in which the silicon species 103 may be incorporated into the exposed portion of the metal line 112 additionally or alternatively to the treatment 102 as illustrated in FIG. 1b. In one illustrative embodiment, the ambient 104 may be established on the basis of a silicon species, which may also result in a modification of exposed surface portions 121S of the dielectric material 121. For instance, a mechanism generally known as silyation may result in a significant hardening of organic materials or other sensitive dielectric materials having a dielectric constant of 2.7 and less. Thus, during the treatment 104, which may be performed on the basis of a gaseous ambient or based on a wet chemical ambient, the species 103 may be incorporated into the surface portions 121S, thereby obtaining a desired hardening or densification of this portion, thereby enhancing the chemical and mechanical characteristics of the dielectric material 121 during the further processing of the device 100. For example, HMDS in gaseous or liquid form may be used as a silicon-containing species for obtaining the hardened or densified surface portions 121S. Furthermore, during the process 104, process parameters, such as the concentration of the silicon-containing precursor materials, the temperature and in particular the duration, may be appropriately controlled to incorporate a specific amount of silicon species 103 in the exposed surface portion of the metal line 112 so as to obtain the compound 103A. For this purpose, the concentration of silicon-containing species may be increased or additional precursor materials including species may be added to the ambient 104, at least during a specific phase of the process in order to obtain the desired characteristics, such as silicon concentration and penetration depth of the compound 103A. In some illustrative embodiments, a specific amount of the compound 103A may have been formed in the preceding process step, such as the process 102, so that, in combination with the treatment 104, a desired configuration of the compound 103A may be obtained. Appropriate process parameters, for instance concentration of precursor materials, such as HMDS, temperature and duration, may be established on the basis of test runs.

Figure 1D:
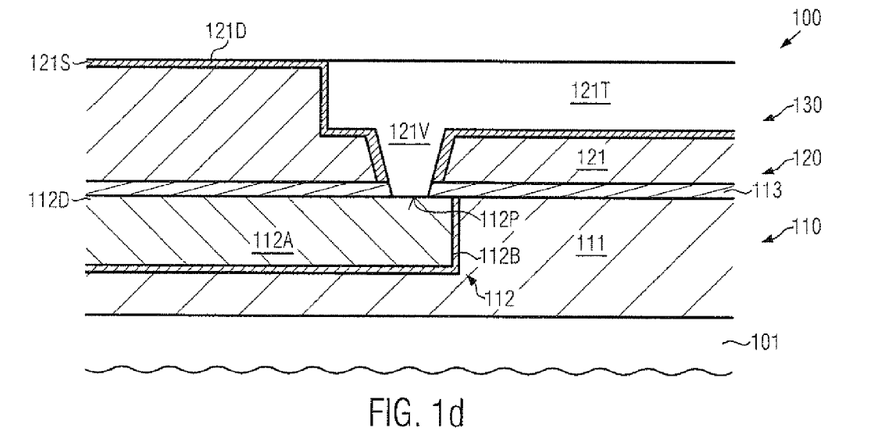
FIGS. 1d-1e schematically illustrate cross-sectional views of the semiconductor device during various manufacturing stages in which the material characteristics of a damaged surface portion of a sensitive low-k dielectric material may at least be partially re-established by a corresponding surface treatment, which may be appropriately adapted so as to also locally form a copper silicide in a surface area exposed by a via opening, according to yet other illustrative embodiments.

FIG. 1d schematically illustrates the semiconductor device 100 in a manufacturing stage in which the via opening 121V extends to or into the metal line 112, thereby exposing the portion 112P. Furthermore, at least the dielectric material 121 may be provided as an ultra low-k dielectric material, which may have an increased sensitivity to chemical interactions with reactive ambients, as previously discussed. Consequently, during the preceding processes, in particular during the patterning of the trench 121T and the via opening 121V, exposed surface areas may be increasingly damaged, while also, during corresponding processes for removing resist materials and any contaminants, a damaged zone 121D may be created in the sensitive ULK material. Since the damaged zone 121D may significantly influence the further processing, for instance, the deposition of a conductive barrier material and the like, and a removal of the damaged zone 121D may result in an increase of the overall dimensions, in particular of the opening 121V, a "repair" or re-establishment, at least to a certain degree, of the initial surface characteristics may be performed.

Figure 1E:
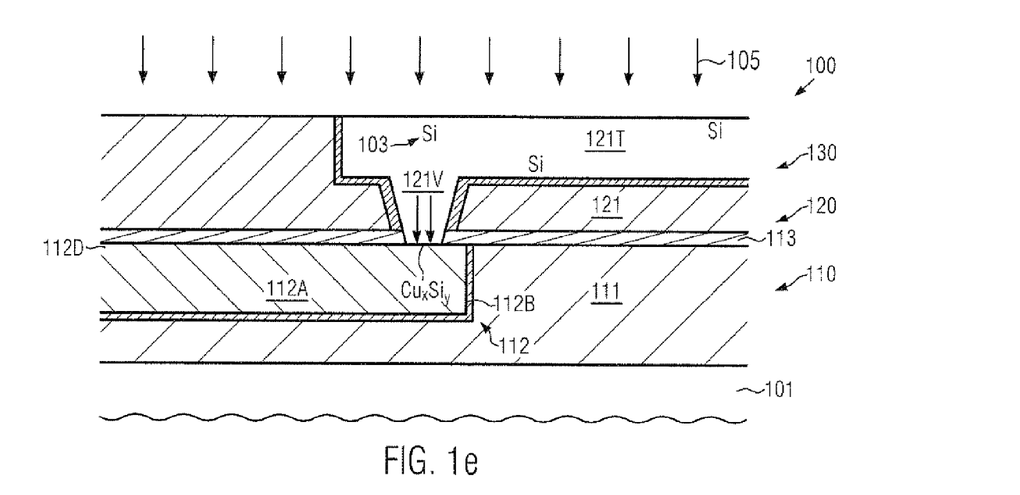

FIG. 1e schematically illustrates the semiconductor device 100 when exposed to a surface treatment 105, which may be performed on the basis of a silicon species, which may also be incorporated into the exposed portion 112P. For instance, appropriate process parameters, such as temperature and the composition of the silicon-containing chemicals may be selected so as to form the compound 103A (FIG. 1c) while also "repairing" the damaged zone 121D (FIG. 1d). In some illustrative embodiments, the process 105 may be performed on the basis of HMDS, wherein additional silicon-containing precursor materials may be used if a higher silicon concentration may be required. Also in this case, appropriate process parameters may be readily established by performing corresponding test runs. It should be appreciated that, in some illustrative embodiments, one or more of the processes 102, 104 and 105 may be combined so as to obtain a finally desired concentration of the silicon species in the compound 103A, while also adjusting the desired penetration depth.

Thereafter, the further processing may be continued by depositing a conductive barrier material and filling the trench 121T and the via opening 121V with a copper material.

Figure 1F:
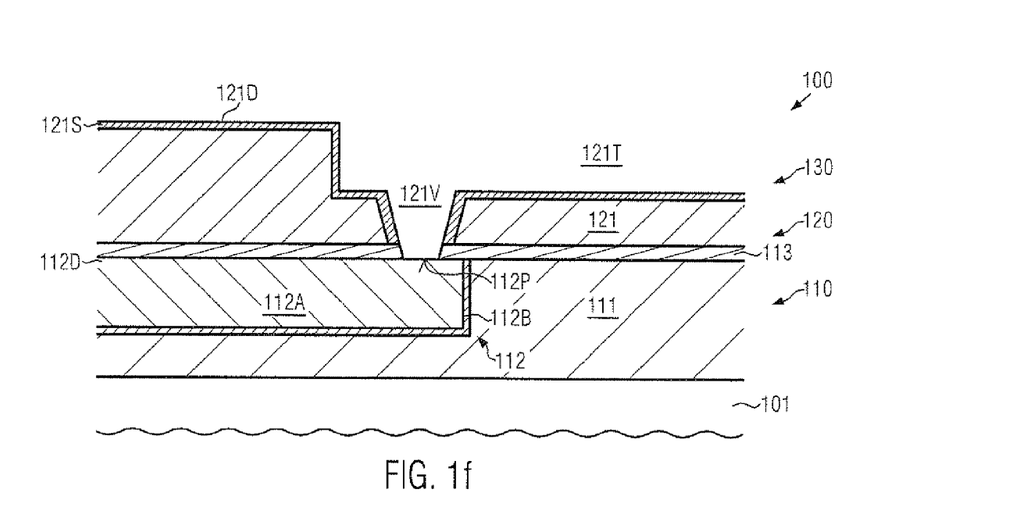
FIGS. 1f-1i schematically illustrate cross-sectional views of a semiconductor device during various manufacturing stages in forming a metallization system, wherein a copper silicide may be locally formed in a highly controllable manner by forming a precursor layer including the silicon species and subsequently creating decomposition of the precursor layer, according to still other illustrative embodiments.

FIG. 1f schematically illustrates a cross-sectional view of the semiconductor device 100 according to illustrative embodiments in which the portion 112P is exposed in the via opening 121V. Furthermore, depending on the overall process strategy, any contaminants may have been removed and the surface portion 121S of the dielectric material 121 may be in any appropriate condition so as to enable the deposition of a conductive barrier material. For example, any of the treatments described above may have been performed to provide the desired surface characteristics of the dielectric material 121. In other illustrative embodiments, the surface portion 121S may still be in a damaged state or may still require a modification, for instance with respect to hardening or densifying the material, as previously explained.

Figure 1G:
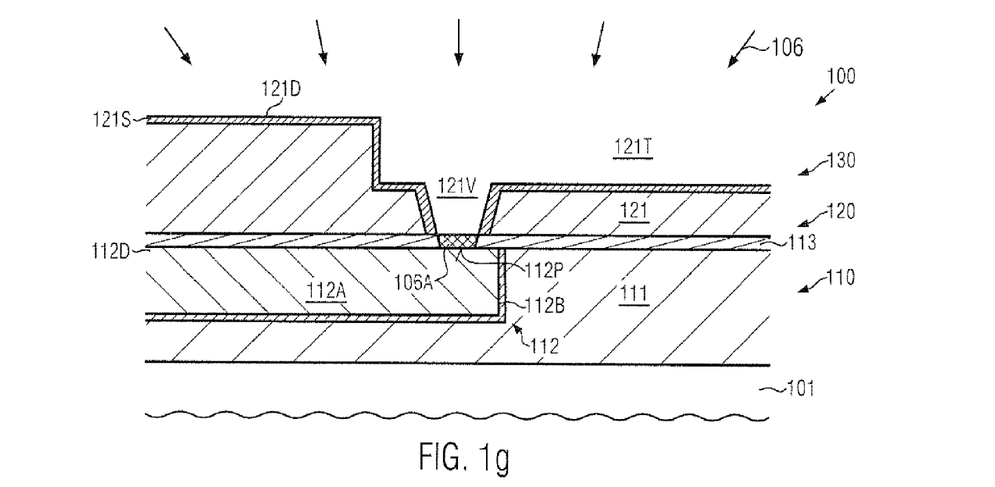

FIG. 1g schematically illustrates the semiconductor device 100 in a further advanced stage in which the device 100 is exposed to a wet chemical ambient 106 which may comprise an appropriate chemical agent that may selectively adhere to the exposed portion 112P, while substantially not affecting the dielectric surface portion 121S. In one illustrative embodiment, the wet chemical ambient 106 may be established on the basis of triazole or any derivative thereof, for instance benzene triazole (BTA), which may be used as a carrier substance for incorporating a silicon species. As is well known, these chemical agents may have a part in the corresponding molecules that may efficiently adhere to copper atoms, while any bonds with the dielectric material of the surface portion 121S may be effectively suppressed. Hence, the silicon species may be implemented into the basic carrier molecules by substituting corresponding atoms bonded to the nitrogen of the carrier molecule, thereby yielding a specific "enrichment" with the silicon species. Furthermore, if desired, corresponding functional groups of the carrier molecules may be appropriately selected in order to incorporate additional species, such as metals and the like, while also providing the possibility of adjusting the size of the carrier molecules. In this manner, carrier substance may be appropriately adapted to provide defined conditions at the exposed surface portion 112P for incorporating the silicon species. Thus, during the interaction of the carrier molecules of the ambient 106 with the exposed portion 112P, i.e., the copper atoms contained therein, a well-defined precursor layer 106A may form which may eventually correspond to a mono-molecular layer, thereby providing a self-limiting mechanism. Furthermore, the concentration of the available silicon species may be adjusted in advance by selecting a specific size of the carrier molecules, for instance, by using specific functional groups connected to the nitrogen bonds of the carrier molecules.

Figure 1H:
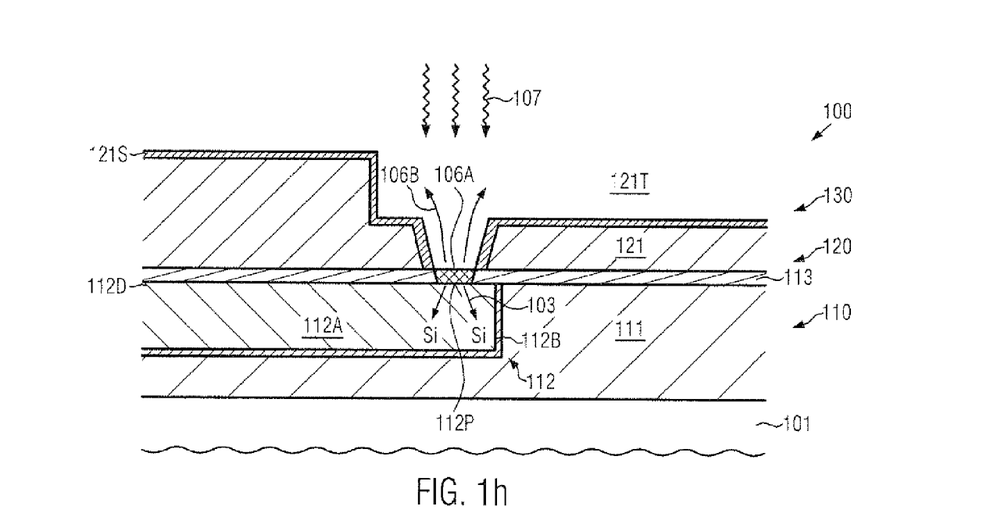

FIG. 1h schematically illustrates the semiconductor device 100 in an advanced manufacturing step in which decomposition of the precursor layer 106A may be initiated on the basis of an appropriate treatment 107, such as the application of elevated temperatures, supply of UV radiation, establishing a plasma ambient and the like. Consequently, during the treatment 107, the chemical bonds are broken and the silicon species 103 may be released, thereby diffusing into the exposed portion 112P, while other volatile components 106B may also be released. Consequently, the local process conditions within the via opening 121V may be controlled with high accuracy due to the well-defined condition of the precursor layer 106A, thereby resulting in a highly controllable and predictable diffusion of silicon into the copper-containing surface 112P. Consequently, the penetration depth and the concentration of the silicon species may be controlled with a high degree of independence of global process parameters, such as overall temperature, pressure and the like. Furthermore, the surface portion 121S of the dielectric material 121 may remain substantially unaffected by the processes 106 and 107, thereby providing a high degree of flexibility in implementing the formation of copper silicide into the overall process flow. For example, the deposition of the precursor layer 106 (FIG. 1g) may be performed immediately prior to the deposition of a conductive barrier material, without deteriorating the characteristics of the exposed surface portions 121S. In other cases, the process may be readily implemented after the etch sequence for forming the trench 121T and the via opening 121V after removing any contaminants, thereby forming the copper silicide in a highly precise manner, thereby also providing a certain degree of integrity during the further processing, when further treatments on the exposed surface portions 121S are to be performed. It should be appreciated that the process of incorporating the silicon species 103 on the basis of the precursor layer 106A (FIG. 1g) may also be combined with any of the above-described process techniques, if desired.

Figure 1I:
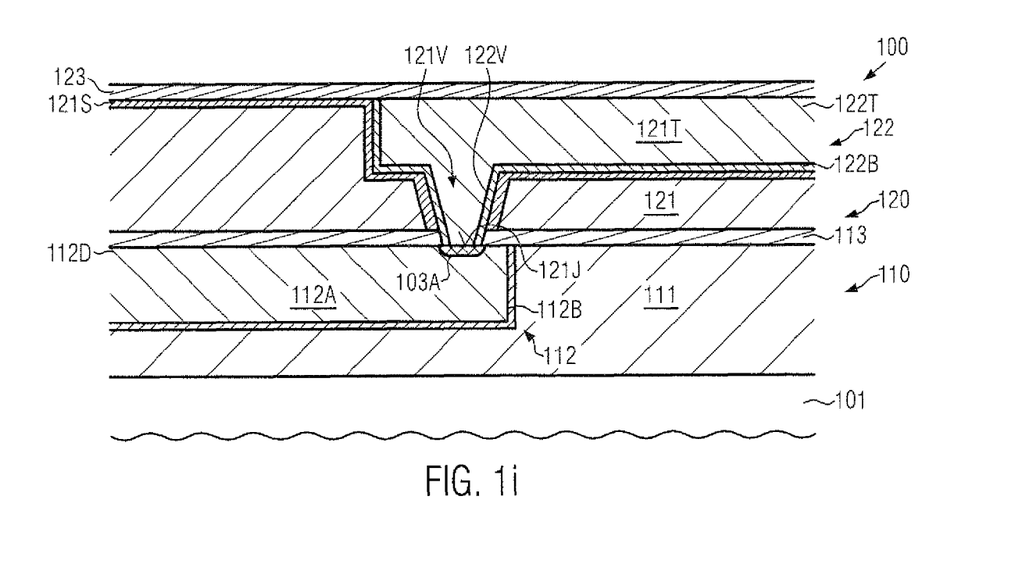

FIG. 1i schematically illustrates the semiconductor device 100 in a further advanced manufacturing stage, i.e., after performing at least one of the mechanisms for locally forming the copper silicide 103A in the vicinity of the interface 121J between the via 121V and the metal line 112. Furthermore, as illustrated, the metallization layer 120 may now comprise a metal line 122T in combination with a metal filled via 122V that connects to the metal line 112 by the interface 121J. Moreover, depending on the preceding process strategy for providing a conductive barrier material 122B, the copper silicide 103A may at least be formed so as to laterally enclose the interface 121J. Furthermore, a dielectric cap material 123 may be formed on the metal line 122T and the dielectric material 121. The semiconductor device 100 as shown in FIG. 1i may be formed on the basis of well-established process techniques, i.e., after providing the copper silicide 103A, the conductive barrier layer 122B may be deposited, for instance, by sputter deposition, CVD, atomic layer deposition (ALD) and the like, possibly in combination with the deposition of an appropriate seed material, such as copper and the like. Thereafter, copper may be filled in by electrochemical deposition techniques, such as electroplating, electroless plating and the like. Any excess material may then be removed by CMP followed by the deposition of the dielectric cap material 123. It should be appreciated that further metallization layers may be formed above the metallization layer 120 depending on the overall device complexity, wherein similar techniques may also be used for enhancing the electromigration behavior of critical areas centered around a corresponding interface between a lower-lying metal line and a via.

As a result, the present disclosure provides techniques and semiconductor devices in which a copper silicide or copper/silicon compound may be locally formed in the critical area around an interface formed between a metal line and a via, thereby locally increasing the electromigration performance, while avoiding the necessity for providing metal cap layers and/or performing surface modification process of the metal line as a whole, with enhanced thickness, which may conventionally result in a reduced electrical performance. The incorporation of the silicon species may be accomplished without unduly increasing the overall process complexity. For example, the local copper silicide may be formed while at the same time performing appropriate treatments, such as removal of contaminants, hardening or densifying exposed surface portions of the dielectric material and/or reducing etch-related damage of the dielectric material. In still other illustrative embodiments, in addition to or alternatively, a silicon-containing precursor layer may be formed in a highly controllable manner, which may then be decomposed so as to initiate the silicon diffusion.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a metallization system of a semiconductor device, the method comprising:
    forming an opening in a dielectric layer of a first metallization layer of said metallization system, said opening exposing a portion of a copper-containing metal region of a second metallization layer of said metallization system;
    forming a trench in a portion of said dielectric layer so as to connect to said opening;
    forming a copper/silicon compound selectively in said exposed portion of said copper-containing metal region; and
    after forming said copper/silicon compound, filling said trench and said opening in a common deposition process with a metal-containing material.

2. The method of claim 1, wherein forming said copper/silicon compound comprises treating said exposed portion in a silicon-containing plasma ambient.

3. The method of claim 2, wherein said plasma ambient comprises at least one reactive component so as to remove contaminants generated during an etch process performed to form said opening.

4. The method of claim 3, wherein said at least one reactive component comprises oxygen.

5. The method of claim 1, wherein forming said copper/silicon compound comprises establishing a silicon-containing ambient and initiating diffusion of silicon species into said exposed portion and into exposed surface areas of said dielectric layer so as to modify a molecular structure of said exposed surface areas.

6. The method of claim 5, wherein said dielectric layer comprises a material having a dielectric constant of 2.7 or less.

7. The method of claim 6, wherein modifying said molecular structure comprises increasing a hardness of said exposed surface areas.

8. The method of claim 6, wherein modifying said molecular structure comprises reducing damage created in said exposed surface areas during one or more preceding processes.

9. The method of claim 1, further comprising forming a dielectric cap layer on said copper-containing metal region and depositing said dielectric layer on said dielectric cap layer.

10. The method of claim 9, wherein said dielectric cap layer is formed on a copper-containing surface of said copper-containing metal region.

11. The method of claim 1, wherein forming said silicon/copper compound comprises forming a precursor layer selectively on said exposed portion of said copper-containing metal region and initiating a decomposition of said precursor layer so as to initiate silicon diffusion into said exposed portion.

12. The method of claim 11, wherein said precursor layer comprises a carrier material based on at least one of triazole and a derivative and silicon bonded to said carrier material.

13. A method, comprising:
    forming a dielectric cap material on a copper-containing surface of a metal region of a first metallization layer of a metallization system of a semiconductor device;
    forming a low-k dielectric material of a second metallization layer above said dielectric cap material;
    forming an opening in said low-k dielectric material so as to expose a portion of said copper-containing surface; and
    forming a silicon and copper-containing mixture in said metal region through said portion of said copper-containing surface, wherein forming said silicon and copper-containing mixture comprises establishing a silicon-containing plasma ambient, said plasma ambient comprising at least one reactive component so as remove organic material.

14. A method of forming a metallization system of a semiconductor device, the method comprising:
    forming an opening in a dielectric layer of a first metallization layer of said metallization system, said opening exposing a portion of a copper-containing metal region of a second metallization layer of said metallization system; and
    forming a copper/silicon compound selectively in said exposed portion of said copper-containing metal region, wherein forming said copper/silicon compound comprises treating said exposed portion in a silicon-containing plasma ambient, said plasma ambient comprising at least one reactive component so as to remove contaminants generated during an etch process performed to form said opening.

15. The method of claim 14, wherein said at least one reactive component comprises oxygen.

16. A method of forming a metallization system of a semiconductor device, the method comprising:
    forming an opening in a dielectric layer of a first metallization layer of said metallization system, said opening exposing a portion of a copper-containing metal region of a second metallization layer of said metallization system, and said dielectric layer comprising a material having a dielectric constant of approximately 2.7 or less; and
    forming a copper/silicon compound selectively in said exposed portion of said copper-containing metal region, wherein forming said copper/silicon compound comprises establishing a silicon-containing ambient and initiating diffusion of silicon species into said exposed portion and into exposed surface areas of said dielectric layer so as to modify a molecular structure of said exposed surface areas.

17. The method of claim 16, wherein modifying said molecular structure comprises increasing a hardness of said exposed surface areas.

18. The method of claim 16, wherein modifying said molecular structure comprises reducing damage created in said exposed surface areas during one or more preceding processes.

19. A method of forming a metallization system of a semiconductor device, the method comprising:

forming an opening in a dielectric layer of a first metallization layer of said metallization system, said opening exposing a portion of a copper-containing metal region of a second metallization layer of said metallization system; and forming a copper/silicon compound selectively in said exposed portion of said copper-containing metal region, wherein forming said silicon/copper compound comprises forming a precursor layer selectively on said exposed portion of said copper-containing metal region and initiating a decomposition of said precursor layer so as to initiate silicon diffusion into said exposed portion.

20. The method of claim 19, wherein said precursor layer comprises a carrier material based on at least one of triazole and a derivative and silicon bonded to said carrier material.

21. A method, comprising:

forming a dielectric cap material on a copper-containing surface of a metal region of a first metallization layer of a metallization system of a semiconductor device;

forming a low-k dielectric material of a second metallization layer above said dielectric cap material;

forming an opening in said low-k dielectric material so as to expose a portion of said copper-containing surface; and forming a silicon and copper-containing mixture in said metal region through said portion of said copper-containing surface, wherein forming said silicon and copper-containing mixture comprises establishing a silicon-containing ambient and modifying exposed surface areas of said low-k dielectric material, said silicon-containing ambient comprises hexamethyldisilazane (HMDS).

* * * * *